United States Patent [19]
Takahashi et al.

[11] Patent Number: 5,809,039
[45] Date of Patent: Sep. 15, 1998

[54] SEMICONDUCTOR INTEGRATED CIRCUIT DEVICE WITH DIAGNOSIS FUNCTION

[75] Inventors: Toshiro Takahashi, Ohme; Fumihiko Shirotori, Fussa; Kaoru Moriwaki, Hadano; Masahiko Nagai, Kanagawa, all of Japan

[73] Assignee: Hitachi, Ltd., Tokyo, Japan

[21] Appl. No.: 603,502

[22] Filed: Feb. 20, 1996

Related U.S. Application Data

[63] Continuation of Ser. No. 123,789, Sep. 20, 1993, abandoned.

[30] Foreign Application Priority Data

Sep. 24, 1992 [JP] Japan .................................. 4-254853

[51] Int. Cl.⁶ ............................. G01R 31/28; G11C 29/00
[52] U.S. Cl. ........................................ 371/22.3; 371/21.1
[58] Field of Search ................................. 371/22.3, 22.1, 371/10.3, 21.1, 21.2, 22.2, 22.4, 22.5, 22.6; 327/203; 307/279

[56] References Cited

U.S. PATENT DOCUMENTS

| | | | |
|---|---|---|---|
| 4,553,236 | 11/1985 | Zasio et al. | 371/22.3 |
| 4,680,761 | 7/1987 | Burkness | 371/22.1 |
| 4,698,588 | 10/1987 | Hwang et al. | 371/22.3 |
| 4,701,887 | 10/1987 | Ogawa | 371/10.3 |
| 4,829,237 | 5/1989 | Segawa et al. | 371/22.1 |
| 4,862,068 | 8/1989 | Kawashima et al. | 371/22.3 |
| 4,893,072 | 1/1990 | Matsumoto | 371/22.3 |
| 4,910,735 | 3/1990 | Yamashita | 371/22.1 |
| 4,912,395 | 3/1990 | Sato et al. | 371/22.3 |
| 5,006,787 | 4/1991 | Katircioglu et al. | 371/21.2 |
| 5,012,180 | 4/1991 | Dalrymple et al. | 371/22.1 |
| 5,084,874 | 1/1992 | Whetsel, Jr. | 371/22.3 |
| 5,115,191 | 5/1992 | Yoshimori | 371/22.3 |
| 5,124,589 | 6/1992 | Shiomi et al. | 371/21.1 |
| 5,138,619 | 8/1992 | Fasang et al. | 371/21.1 |
| 5,161,160 | 11/1992 | Yaguchi et al. | 371/22.3 |
| 5,227,674 | 7/1993 | Takahashi et al. | 307/279 |
| 5,247,521 | 9/1993 | Akao et al. | 371/22.1 |
| 5,341,096 | 8/1994 | Yamamura | 371/22.3 |
| 5,371,748 | 12/1994 | Saw et al. | 371/21.1 |
| 5,377,200 | 12/1994 | Pedneau | 371/22.3 |
| 5,378,934 | 1/1995 | Takahashi et al. | 327/203 |
| 5,388,104 | 2/1995 | Shirotori et al. | 371/22.3 |
| 5,400,281 | 3/1995 | Morigami | 371/21.1 |
| 5,416,919 | 5/1995 | Ogino et al. | 371/22.1 |
| 5,442,642 | 8/1995 | Ingalls et al. | 371/21.1 |
| 5,442,643 | 8/1995 | Adachi | 371/22.1 |

OTHER PUBLICATIONS

Kuboki, Shigeo, et al. "Topic LSI Design 5 Gate Array Test Design Automation Test Circuit and Pattern Generation Automation," Nikkei Electronics, No. 400, Jul. 28, 1986, pp. 301–322. (English translation included).

*Primary Examiner*—Emanuel T. Voeltz
*Assistant Examiner*—Eric W. Stamber
*Attorney, Agent, or Firm*—Fay, Sharpe, Beall, Fagan, Minnich & McKee

[57] ABSTRACT

A logic LSI is divided into a plurality of functional blocks, and an output portion of each functional block is provided with a buffer circuit with a scan function which can change a function of latching data by a control signal and a function of making an input signal pass intact. The buffer circuit is connected to a test exclusive bus and the test data can be entered directly to the buffer or read out of the buffer. Test patterns are generated in each functional block and diagnosis can be carried out in each functional block. When the functional block is used in other LSI, since the test patterns already generated can be utilized, the time required for generation of test patterns and for the test can be significantly reduced.

16 Claims, 13 Drawing Sheets

| TE | SWi | SRi | MODE |
|---|---|---|---|
| L | L | L | NORMAL<br>$D_{IN}$ —▷— $D_{OUT}$<br>(BUFFER) |
| H | ⎍ | L | SCAN-IN / HOLD<br>[FF] — $D_{OUT}$<br>$\overline{SiD}$ |
| L | L | H | SCAN - OUT<br>$D_{IN}$ —▷—•—<br>SoD |

FIG. 12

| TE | C1 | C2 | MODE |
|---|---|---|---|
| L | L | L | NORMAL<br>$D_{IN}$ —▷— $D_{OUT}$ |
| H | ⎍ | L | SCAN-IN<br>[M]—[S]<br>↑ SiD |
| H | L | ⎍ | MASTER - SLAVE TRANSFER<br>[M]→[S]<br>↓ SoD |
| ⎍ | L | ⎍ | $D_{IN}$ FETCHED<br>$D_{IN}$→[M]→$D_{OUT}$<br>↓[S]<br>↓ SoD |

FIG. 13

SEMICONDUCTOR INTEGRATED CIRCUIT DEVICE WITH DIAGNOSIS FUNCTION

This is a continuation of application U.S. Ser. No. 08/123,789, filed Sep. 20, 1993 now abandoned.

BACKGROUND OF THE INVENTION

The present invention relates to semiconductor integrated circuit technology and to effective technology to be applied to a diagnosis system in a semiconductor integrated circuit device, and more particularly, for example, relates to effective technology to be applied to ASIC (Application Specific Integrated circuit) technology in gate array systems, standard cell systems or module base systems.

A semiconductor integrated circuit device (logic large scale integrated circuit device or logic LSI) has integrated therein several ten thousand or more gates and includes a number of flip-flops. However, the number of input/output terminals is limited to several hundred at most. Test patterns for testing such complicated sequential circuits of large scale with flip-flops inserted in a signal transmission path from limited external terminals cannot be produced even using a computer to its full capacity.

Therefore, as a diagnosis system of a semiconductor integrated circuit device, a diagnosis system called an address scan system has been proposed. Flip-flops to constitute a sequential circuit are connected in series and are operated as a shift register thereby diagnosis is made easy. A diagnosis system called address scan system has also been proposed. Addresses are allocated to flip-flops and data can be entered directly in a desired flip-flop using a test exclusive bus from the outside (scan in) and data that is held in the flip-flop can be read out (scan out) (refer to Nikkei Electronics, Jul. 28, 1986, pp. 301–322).

SUMMARY OF THE INVENTION

However, as a semiconductor integrated circuit becomes large scale having, for example, to several hundred gates, the number of flip-flops in the inside is further increased. Therefore even if a shift scan system and an address scan system in the prior art are used, time required for production of test patterns and for testing of a semiconductor integrated circuit device using the test patterns becomes massive, and, even if test patterns are produced using a super computer, several tens of hours are required. Also if such massive test patterns are used, time required for diagnosing a semiconductor integrated circuit device becomes very long. Moreover, when even a minor correction of logic is required, there is a fear that sufficient diagnosis results cannot be obtained because test patterns must be produced again by spending several tens of hours in development.

An object of the present invention is to provide a diagnosis system in a logic integrated circuit (semiconductor integrated circuit) with a diagnosis function where production of test patterns and testing are easy.

Another object of the present invention is to provide a buffer circuit which is preferable to realize a diagnosis system in a logic integrated circuit with a diagnosis function where production of test patterns and testing are easy.

The foregoing and other objects and novel features of the present invention will be apparent from the description of the specification and the accompanying drawings.

An outline of the representative invention disclosed in the present patent application will be described as follows.

A semiconductor integrated circuit device is divided into a plurality of functional blocks, and an output portion of each functional block is provided with buffer circuits in constitution to enable changing between a function of latching data by a control signal and a function of making an input signal pass intact (hereinafter referred to as "buffer circuits with scan function"). These buffer circuits are connected to a test exclusive bus thereby test data can be entered directly to the buffer or read out of the buffer. Also, flip-flops within each functional block are preferably connected to the test exclusive buffer thereby the test data can be scanned in or scanned out directly.

Further, the buffer circuits with a scan function are provided with a logic gate to make the input signal pass or to interrupt it by a changing control signal, a latch circuit connected to rear stage of the logic gate, a switch installed on the midway of the return path of the latch circuit and capable of interrupting this, a switch for entering test data to the input side of the latch circuit, and a switch for taking the latch data out of the output terminal of the latch circuit.

According to the above-mentioned means, test patterns are produced in each functional block and a diagnosis can be carried out in each functional block. When a functional block once designed is to be used in another semiconductor integrated circuit device, since test patterns already produced can be utilized, time required for production of test patterns and the test can be significantly reduced in comparison with diagnosis system in the prior art.

BRIEF DESCRIPTION OF THE DRAWINGS

FIG. 12 is a table showing three modes of operation of buffer circuits; and,

FIG. 13 is a table showing four modes of operation of a buffer circuit.

DESCRIPTION OF THE PREFERRED EMBODIMENT

Embodiments of the present invention will be described referring to the accompanying drawings.

Figure 1:
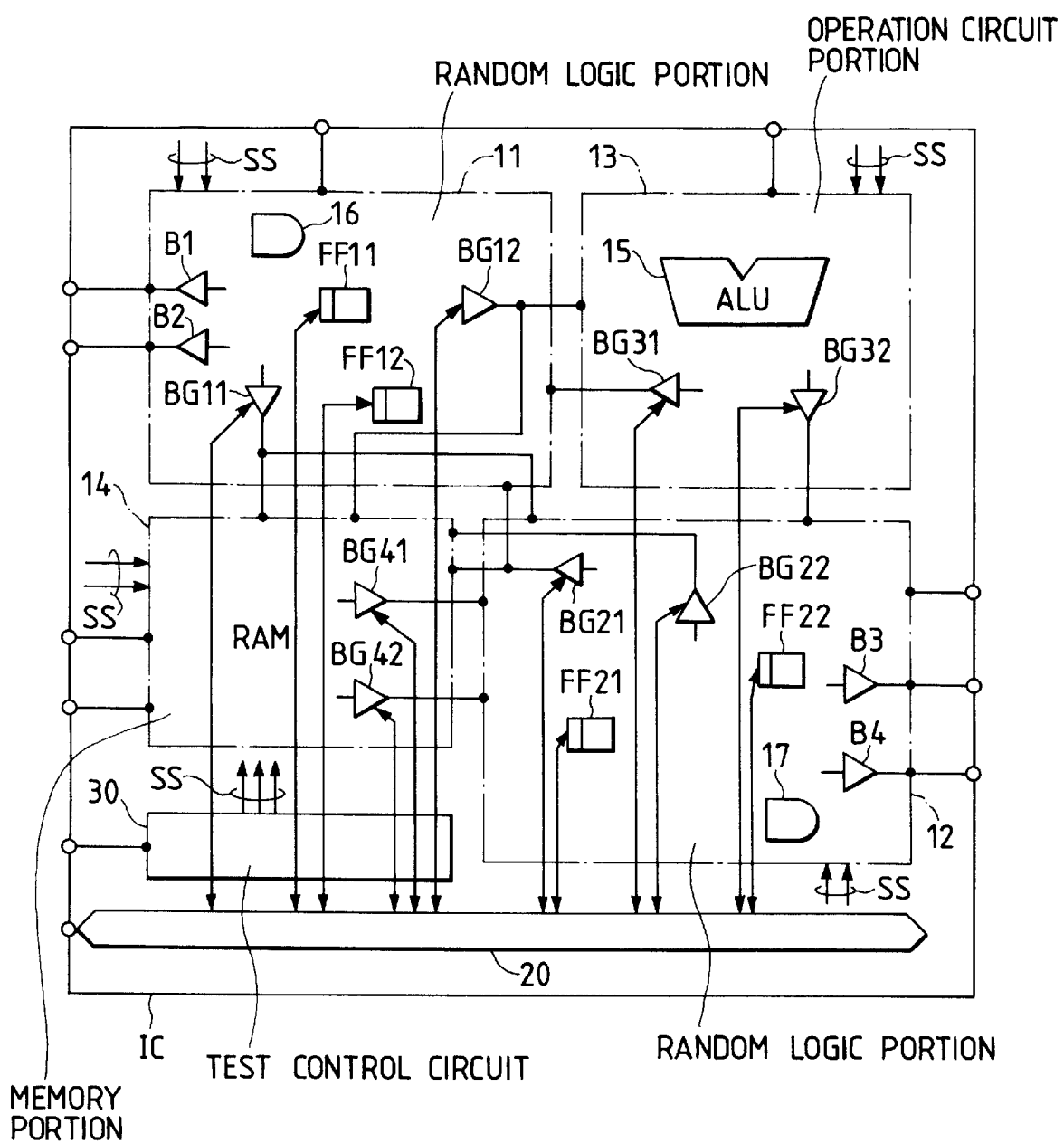
FIG. 1 is a block diagram showing schematic constitution of a semiconductor integrated circuit device as a whole to which the present invention is applied.

FIG. 1 shows schematic constitution of a large scale semiconductor integrated circuit device IC (hereinafter referred to also as "logic integrated circuit or logic LSI") as a whole to which the present invention is applied. The semiconductor integrated circuit device is formed on one semiconductor substrate (chip) such as silicon by a known semiconductor manufacturing method. In FIG. 1, numerals 11, 12 designate random logic portions respectively having prescribed logic, numeral 13 designates an operation circuit portion, and numeral 14 designates a memory circuit portion comprising RAM (random access memory) or the like. Although not particularly limited thereto, in this embodiment, in the operation circuit 13 and the memory circuit 14, a macro cell registered as a cell library having use results already in used. The blocks 11–14 are deemed as functional circuit blocks or functional blocks respectively.

Also in FIG. 1, BG11–BG42 designate buffer circuits (buffer means) with a scan function provided in the output portion of each of the functional circuit blocks (first to fourth functional blocks) 11, 12, 13, 14. FF11–FF22 designate flip-flops for a data latch provided in the random logic portions 11, 12 respectively. A scan function is added to the buffer circuits BG11–BG42 and the flip-flops FF11–FF22 respectively.

Further, the functional blocks 11 and 12 include logic circuits 16 and 17 and output circuits B1, B2, B3, B4 for outputting signals to the outside of the semiconductor integrated circuit device. For example, the logic circuits 16 and 17 are an AND circuit, a NAND circuit, an OR circuit, a NOR circuit, a NAND circuit, an OR circuit, a NOR circuit, an ExOR circuit or an ExNOR circuit. Also the functional block 13 is, for example, a CPU (central processing unit), and includes an arithmetic and logic unit ALU.

Also in this embodiment, a test exclusive bus (test exclusive line) 20 is provided on the chip, and the buffer circuits BG11–BG42 and the flip-flops FF11–FF22 are connected to the test exclusive bus 20 for sending or receiving data. The output circuits B1–B4 may be connected to the test exclusive bus 20. Further in this embodiment, a test control circuit 30 is installed to form selective signals SS to scan in or scan out the test data directly through the test exclusive bus to the buffer circuits BG11–BG42 and the flip-flops FF11–FF22.

The test control circuit 30 includes a decoder to form selective signals SS to assign which of the functional circuit blocks 11–14 should be made the test object during diagnosis. The selective signals SS are connected to the functional circuit blocks 11–14 respectively through wiring (not shown), and used for selection of the test object flip-flops and the buffer circuits BG11–BG42 of the test object functional circuit blocks.

Moreover is this embodiment, although not particularly limited thereto, the random logic portions 11 and 12 are constituted so as to enable diagnosis in different systems respectively. That is, the random logic portion 11 carries out diagnosis in an address scan system, and the random logic portion 12 carries out diagnosis in the shift scan system.

Figure 2:
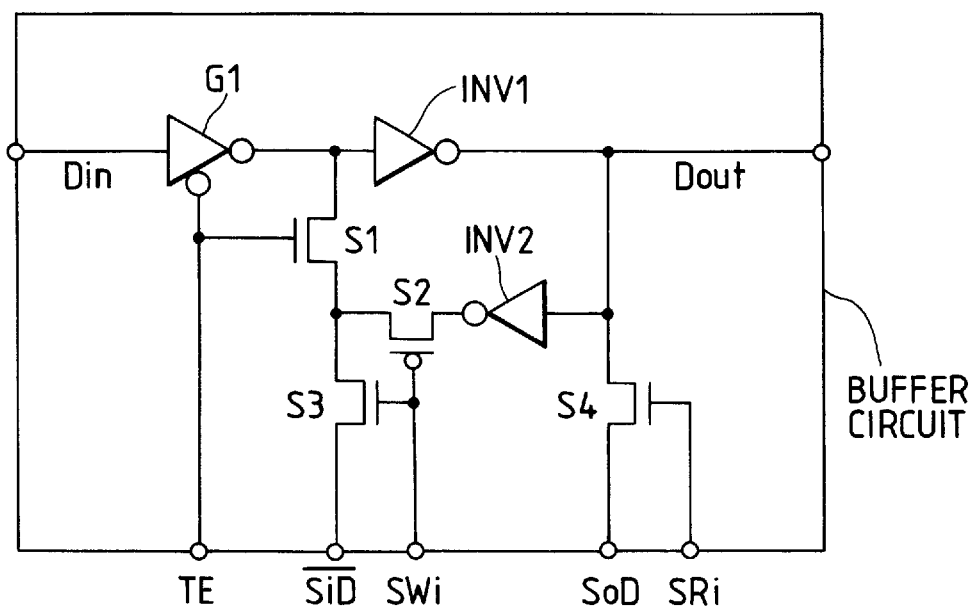
FIG. 2 is a circuit constitution diagram showing an embodiment of a buffer circuit with scan function.

FIG. 2 shows an embodiment of concrete circuit constitution of the buffer circuits BG11–BG42.

The buffer circuit of this embodiment comprises a logic gate G1 such as a clock inverter for making an input signal pass or interrupting it by a changing control signal TE, a latch circuit connected to rear stage of the logic gate G1, a switch S1 installed at the midway of the return path of the latch circuit to enable that a feedback signal made as an output signal of the latch circuit is inputted as an input signal to the latch circuit, switches S2 and S3 for entering test data to the input side of the latch circuit by a scan-in control signal SWi, and a switch S4 for taking-out latch data from the output terminal of the latch circuit by a scan-out control signal SRi. The latch circuit is constituted by an output inverter INV1 and a feedback inverter INV2.

The buffer circuits BG11–BG42 with a scan function operate in three modes by combination of the three control signals TE, SWi, SRi as shown in FIG. 12. That is, when the control signals TE, SWi, SRi are all at a low level, the switch S1 is turned off and the logic gate G1 is activated, thereby the circuits BG11–BG42 act as buffers to make the input signal Din pass intact. Then, since also the switch S4 is turned off by the control signal SRi, no signal is outputted through the switch S4.

Also in the state that the control signal TE is made high level and the control signal SRi is made low level, the switch S1 is turned on the logic gate G1 is not activated and the switch S4 is turned off. In this state, if the scan-in control signal SWi (clock) made high level is inputted, the switch S2 is turned off and the switch S3 is turned on while the signal SWi is at high level. Then, the scan-in data $\overline{SiD}$ supplied to the buffer circuits are fetched by the latch circuit comprising the inverter INV1 and INV2, and next, when the scan-in control signal SWi is made low level, the latch circuit holds data while the signal SWi is at low level.

Further, in the buffer circuit with scan function, if the control signals TE and SWi are made low level and the control signal SRi is made high level, the logic gate G1 is activated and the switch S1 is turned off and the switch S2 is turned on and the switch S4 is turned on. Therefore the buffer circuit with scan function can make the input signal Din pass, and as a result, it can output the output signal Dout as scan-out signal SoD.

Figure 3:
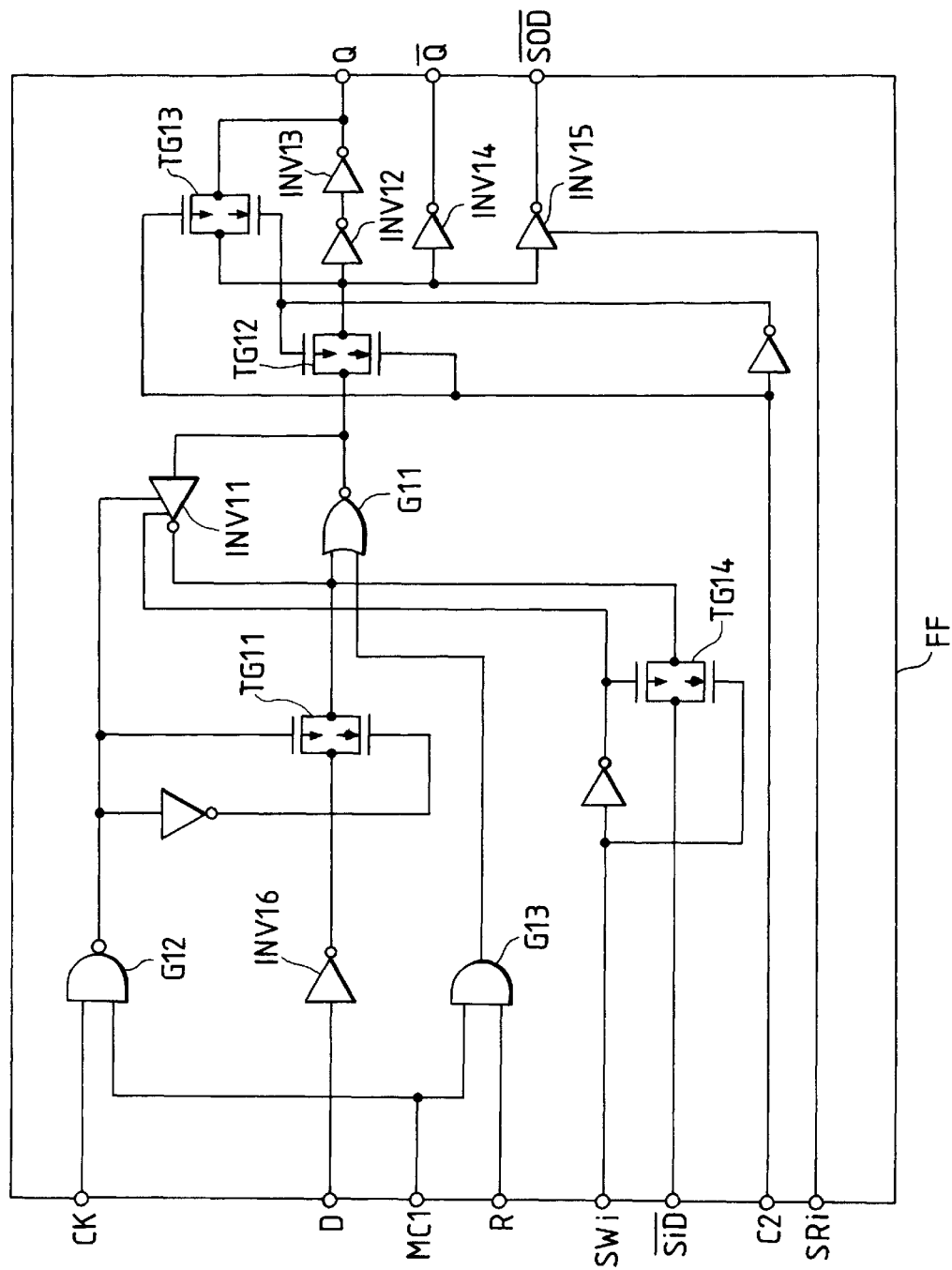
FIG. 3 is a circuit constitution diagram showing an embodiment of a flip-flop with scan function.

FIG. 3 shows an embodiment of a concrete circuit constitution of the flip-flips F11–F22 with a scan function.

The flip-flop in this embodiment is provided, in addition to a data input terminal receiving an original input signal D, with a terminal receiving scan-in data $\overline{SiD}$ for testing and terminals outputting a usual output signal Q and a reverse phase signal Q⁻ thereof, further terminals outputting scan-out data $\overline{SoD}$ during a testing to a test exclusive bus 20 in an address scan system and to a flip-flop of next stage which is connected in series to the present flip-flop and to which the test output signal is to be transmitted in shift scan system.

Further the flip-flops FF11–FF22 are provided with, in addition to terminals to which a usual clock signal CK and a reset R are inputted, input terminals receiving test control signals MC1, SWi, C2 and SRi. Furthermore, among these control signals, the signals SWi and SRi are signals of the same sort as the signals of the same symbols used in the buffer circuit with scan function in FIG. 2.

In the flip-flop of this embodiment, a master latch is constituted by a NOR gate G11 and an inverter INV11, and a slave latch is constituted by an inverters INV12, INV13 and a feedback transfer gate TG13. That is, the flip-flop is made a flip-flop of a master•slave type, and at normal operation state, since control signals MC1 and C2 are made high level and a control signal SWi is made low level, the transfer gate TG12 is rendered conductive and data can be transmitted or received between the master latch and the slave latch. Also since the transfer gate TG13 is interrupted, the slave latch is made data through state.

Further, to one control terminal of the inverter INV11 constituting the master latch is inputted high level being an inverted signal of the control signal SW1 made low level, and to the other control terminal of the inverter INV11 is inputted an output signal of the NAND gate G12. Therefore the inverter INV11 is made interruption state when the clock CK is made high level. The transfer gate TG11 is made conductive state when the clock CK is made high level. Consequently when the clock CK is at high level, the master latch transmits the input signal D of the data input terminal to the slave latch.

As a result, the flip-flop operates as D flip-flop of level sense type in response to an input signal under the condition that the control signals MC1 and C2 are at high level and the control signals R and SWi are at low level. Then, the input signal D is inputted through the inverter INV16 and the transfer gate TG11 to the master latch.

On the other hand, the flip-flop operates as a flip-flop of master•slave type. That is, data of test results inputted from the data input terminal can be fetched by the control signal MC1 of high level, under the condition that the clock CK is at high level and the reset signal R is at low level. Also, by the condition that the control signal MC1 is at low level and the control signal SWi is at high level, in place of interrupting the input of the input signal D to the master latch, the transfer gate TG14 is rendered conductive and the scan-in data Sid for [testing is fetched. Also the fetched data can be transferred from the master latch to the slave latch by the control signal C2, and data of the slave latch can be outputted as scan-out data $\overline{SoD}$ by the control Signal SRi. In addition, the output signals Q⁻ and $\overline{SoD}$ are outputted as opposite phase signals of the output signal Q through the inverters INV14 and INV15 respectively.

The clock CK and the test control signal MC1 are inputted to the NAND gate G12, and by the NAND gate G12, the transfer gate TG11 is constituted so that data of test results inputted to the data input terminal are fetched in the master latch. Also, the reset signal R and the test control signal MC1 are inputted to the AND gate G13, and by the AND gate G13, fetching of data as test results to the master latch (G11, INV11) is controlled. Table 1 and Table 2 show the relation between the input and output of the flip-flop of this embodiment, i.e., truth table.

Table 1 shows the relation between various sorts of input signals for the flip-flop and output data of the master latch corresponding to combination of input data. QmO in Table 1 shows the state wherein the preceding data are held and outputted.

TABLE 1

| Input | | | | | | Output |
|---|---|---|---|---|---|---|
| R | CK | D | M-Cl | SWi | SiD | Qm |
| H | L | * | H | L | * | L |
| H | H | L | H | L | * | L |
| H | H | H | H | L | * | L* |
| L | L | * | H | L | * | QmO |
| L | H | L | H | L | * | L |
| L | H | H | H | L | * | H |
| * | * | * | L | L | * | QmO |
| * | * | * | L | H | L | H |
| * | * | * | L | H | H | L |

Table 2 shows relation between input signals for the slave latch and output data. In Table 2, Q0, Q0⁻ mean that the preceding data are held and outputted. In addition, when the test control signal C2 is at high level, a signal of the same level as that of the input signal to the slave latch is outputted to the output terminal Q, and a signal of opposite level to that of the input signal is outputted to the output terminal Q⁻.

TABLE 2

| Input | Output | |
|---|---|---|
| C2 | Q | $\overline{Q}$ |
| L | Qo | $\overline{Qo}$ |
| H | QM | $\overline{QM}$ |

As above described, the flip-flop of this embodiment does not affect the data output of the slave latch, even if the test results are read in the master latch, and it can carry out the safe test avoiding the racing. Also, for example, if the control signal MC1 is fixed to low level and the control signal SRi is fixed to high level, the transfer gate TG11 is made normally to be in an interruption state and the inverter INV15 is made to be in an outputtable state. Consequently the scan-in data $\overline{SiD}$ from the flip-flops with scan function at front stage of the scan path can be transferred in shift scan to the flip-flop with scan function at rear stage of the scan path by two-phase clocks SWi and C2.

Figure 4:
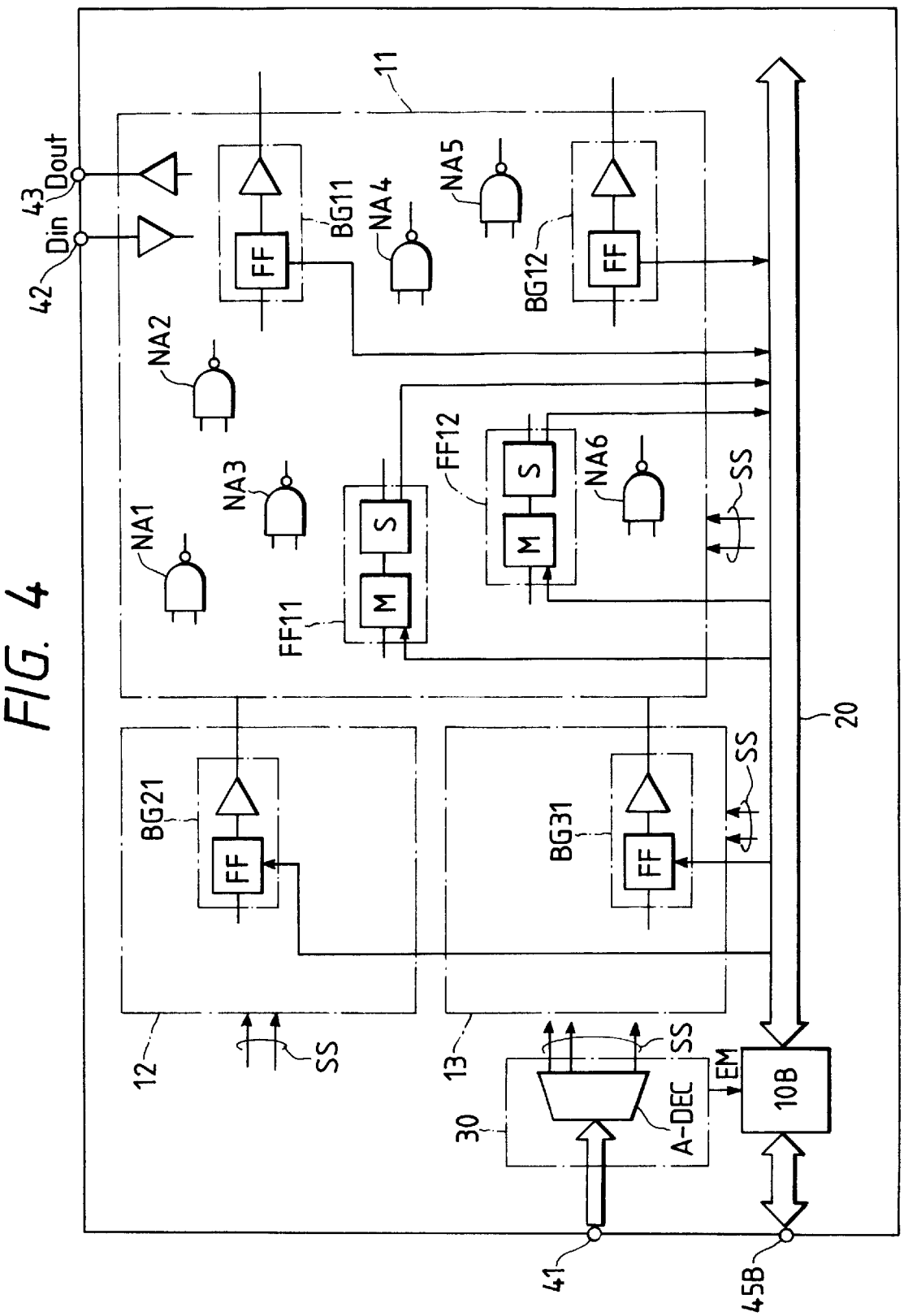
FIG. 4 is an explanation diagram showing flow of data in the case of diagnosing a random logic portion in address scan system.

Next, a concrete method in the case of diagnosing the random logic portion 11 (first functional circuit block) having the buffer with scan function of FIG. 2 in the output portion and using the flip-flop with scan function of FIG. 3 as a flip-flop in address scan system will be described using FIG. 4 and FIG. 5. FIG. 4 shows a logic LSI to which the present invention is applied, and shows clearly a flow of data in the case of diagnosing the random logic portion 11 constituting the logic LSI in an address scan system. The random logic portion 11, although not particularly limited thereto, includes a plurality of two-input NAND circuit NA1–NA6.

Addresses are allocated to the flip-flops FF11, FF12 within the buffer logic portion 11, the buffer circuit BG21 within the random logic portion (second functional block) 12 and the buffer circuit BG31 within the operation circuit portion (third functional circuit block) 13 respectively, and can be selected by the address decoder A-DEC provided within the test control circuit 30 (Address decoder A-DEC supplies a selective signal SS to each functional block).

Further specifically, the selective signals SS include the test control signals TE, SWi, SRi, and the test control signs TE, SWi SRi, NC1, C2 and R supplied from the test control circuit 30 to each flip-flop FFi (i=11, 12) or each buffer circuit BGj (j=11, 12, 21, 31) are supplied only to the circuits selected by the address decoder A-DEC. Although the signals MC1, C2 and R are supplied only to the circuits selected by the address decoder A-DEC in the above description, the constitution is not limited to this but the signals may be supplied from the outside of the semiconductor integrated circuit device directly to the functional block not through the address decoder A-DEC.

Scan-in data for testing is fetched through the test exclusive bus 20 directly in the selected flip-flop or the buffer circuit, and scan-out data of each flip-flop or buffer circuit are outputted onto the test exclusive bus 20. That is, the test exclusive bus 20 is used in any of the read and write operations to the flip-flop and the buffer circuit.

Test data (test input data Din) to be inputted in the random logic portion (first functional block) 11 to diagnose the random logic portion 11 are supplied using buffer circuits BG21, BG31 with scan function installed in the output portion of other functional circuit block, i.e., the random logic portion (second functional circuit block) 12 or the operation circuit portion (third functional circuit block) 13. Specifically, test data are previously inputted and held to the buffer circuit BGj (j=21, 31) within other functional blocks by the address decoder A-DEC. Next, the data are inputted as the test object block to the random logic portion 11 at the test starting. Also, if the random logic portion 11 has an external input terminal 42, the test data (Din) may be inputted also using the terminal.

Figure 5:
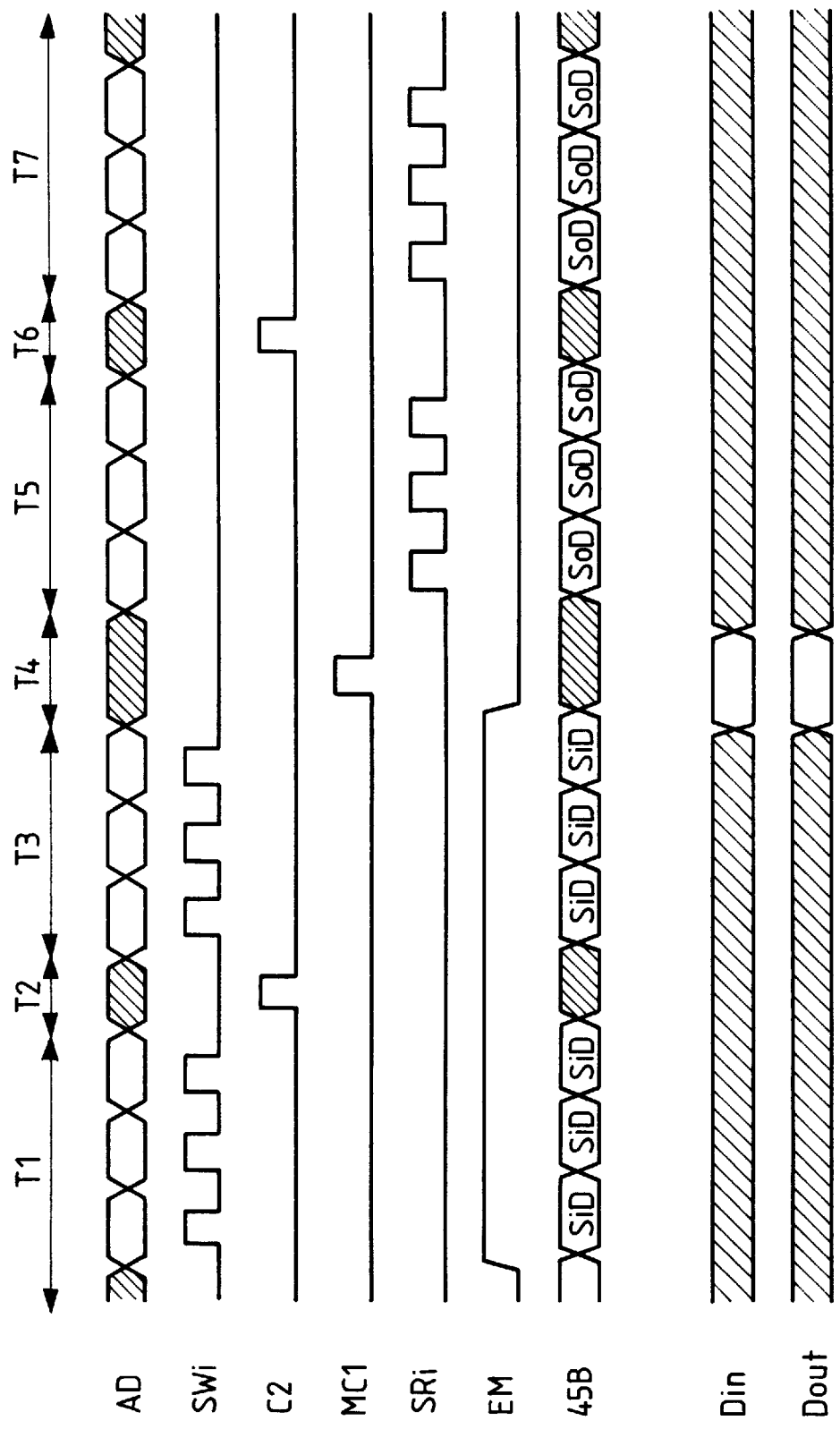
FIG. 5 is a time chart showing timing of various signals in the case of diagnosing a random logic portion in address scan system.

FIG. 5 shows timing of various signals when the random logic portion (first functional circuit block) 11 is diagnosed in the address scan system.

First, address of each flip-flop (i=11, 12) within the random logic portion 11 is supplied from an external terminal 41 to the test control circuit 30 by a tester (test device) and decoded, and the test control signal SWi is supplied to the selected flip-flop FFi (i=11, 12) and at the same time the scan-in data Sid are inputted through the external terminal 45B and the input/output circuit IOB onto the test exclusive bus 20. This is repeated thereby at least a part of the first test data required to test the random logic portion (first functional circuit block) 11 is all set to the flip-flop (T1).

Next, the test control signal C2 is supplied to all flip-flops within the random logic portion 11 (T2). Then in each flip-flop, at least a part of the first test data being set is transferred from the master latch to the slave latch, and at least a part of the first test data can be supplied to the logic gate of next stage on the signal transmission path at normal operation state.

Next, address of the buffer circuit BGj (J=21, 31) of the output portion of other functional blocks (second and third functional blocks) 12, 13 is supplied from the external terminal 41 to the test control circuit 30 and decoded, and the test control signal (scan write signal) SWi is supplied to the selected buffer circuit BGj (j=21, 31) and at the same time the scan-in data Sid are inputted through the external terminal 45B and the input/output circuit onto the test exclusive bus 20. This is repeated thereby at least a part of the first test data to be inputted to the random logic portion 11 is set to the buffer circuit BGj (j=21, 31) with scan function of other functional blocks 12, 13 (T3). Thereby, at least a part of the first test data to test the random logic portion 11 is inputted directly to the random logic portion 11.

Subsequently, when the random logic portion 11 has the external input terminal 42, the test input data are set to the terminal 42. When at least a part of all the first test data to be inputted to the random logic portion 11 is set, the control signal MC1 is inputted (T4). Then, based on a part of the first test data set to the external input terminal 42 and a part of the first test data inputted to the random logic portion 11, the inner logic circuit included in the random logic portion 11 and constituted by the NAND circuits NA1–NA6 operates. The test results operated by the inner logic circuit are taken in the flip-flop of next stage and the buffer circuit of the output portion on the signal transmission path at normal operation state. Then if the random logic portion 11 has an external output terminal 43, the state of the output signal to the terminal 43 is read by a tester installed on the outside of the semiconductor integrated circuit device (T4).

Next, the address of the buffer circuit BGj (j=11, 12) of the output portion within the random logic portion 11 is supplied from the external terminal 41 to the test control circuit 30 and decoded. The test control circuit 30 supplies the test control signal (scan read signal) SRi to the selected buffer circuit BGj (j=11, 12). Then the scan-out data Sid read out of each buffer circuit BGj (j=11, 12) are outputted through wiring (not shown) onto the test exclusive bus 20. The scan-out data Sod on the test exclusive bus 20 are outputted through the input/output circuit IOB to the external terminal 45B. This is repeated and the data on the test exclusive bus 20 outputted from the external terminal 45B can be read in sequence by the tester on the outside. Consequently, data to be outputted from the random logic portion 11 to other functional blocks 12, 13 and the outside of the semiconductor integrated circuit device IC can be known directly using the tester on the outside.

Subsequently, the test control signal C2 is supplied to all flip-flops FF11 and FF12 within the random logic portion 11 (T6). Then in each of the flip-flops FF11 and FF12, the test results fetched in the master latch are transferred to the slave latch.

Finally the address of each of the flip-flops FF11 and FF12 within the random logic portion 11 is supplied from the external terminal 41 to the test control circuit 30 and decoded, and the test control signal (scan read signal) SRi is supplied to the selected flip-flops FF11 and FF12.

Then the scan-out data Sod are outputted from each flip-flop FFi (i=11, 12) onto the test exclusive bus 20. This is repeated and the data on the test exclusive bus 20 are read in sequence by the tester installed on the outside of the semiconductor integrated circuit device, thereby the test results held in all flip-flops within the random logic portion 11 can be known directly from the outside (T7).

In FIG. 5, the control signal EM is an input/output changing control signal of the input/output circuit IOB connected to the test exclusive bus 20. Also in FIG. 5, although a signal can be inputted from the outside through one external terminal 45B or can be outputted to the outside and these two functions are selected in response to function changing of the input/output circuit, constitution is not limited to this. Input and output exclusive terminals as well as an input exclusive circuit and an output exclusive circuit may be provided. Further the test exclusive bus may be constituted by a test data input bus and a test data output bus.

In FIG. 4, although a part of the first test data to diagnose the function of the random logic portion 11 is supplied to the random logic portion 11 utilizing the buffer circuit BG21 with a scan function within the random logic portion 12 and the buffer circuit BG31 with scan function within the operation circuit 13, constitution is not limited to this. The test data may be supplied to the random logic portion utilizing only the buffer circuit BG21 with scan function within the random logic portion 12 or only the buffer circuit BG31 with scan function within the operation circuit 13. Also, in order to diagnose function of t he random logic portion 11, in addition to the buffer circuits BG31, BG21 with scan function, the buffer circuits BG41, BG42 with scan function within the memory circuit portion 14 may be utilized. That is, the test data to diagnose the random logic portion 11 can be supplied to the random logic portion 11 in an arbitrary combination of the buffer circuits with a scan function within the outer functional circuit blocks 12, 13, 14.

Next, concrete method in the case of diagnosing the random logic portion 12 having the buffer with a scan function in the output portion and using the flip-flop with a scan function as a flip-flop in a shift scan system will be described using FIG. 6 and FIG. 7.

Figure 6:
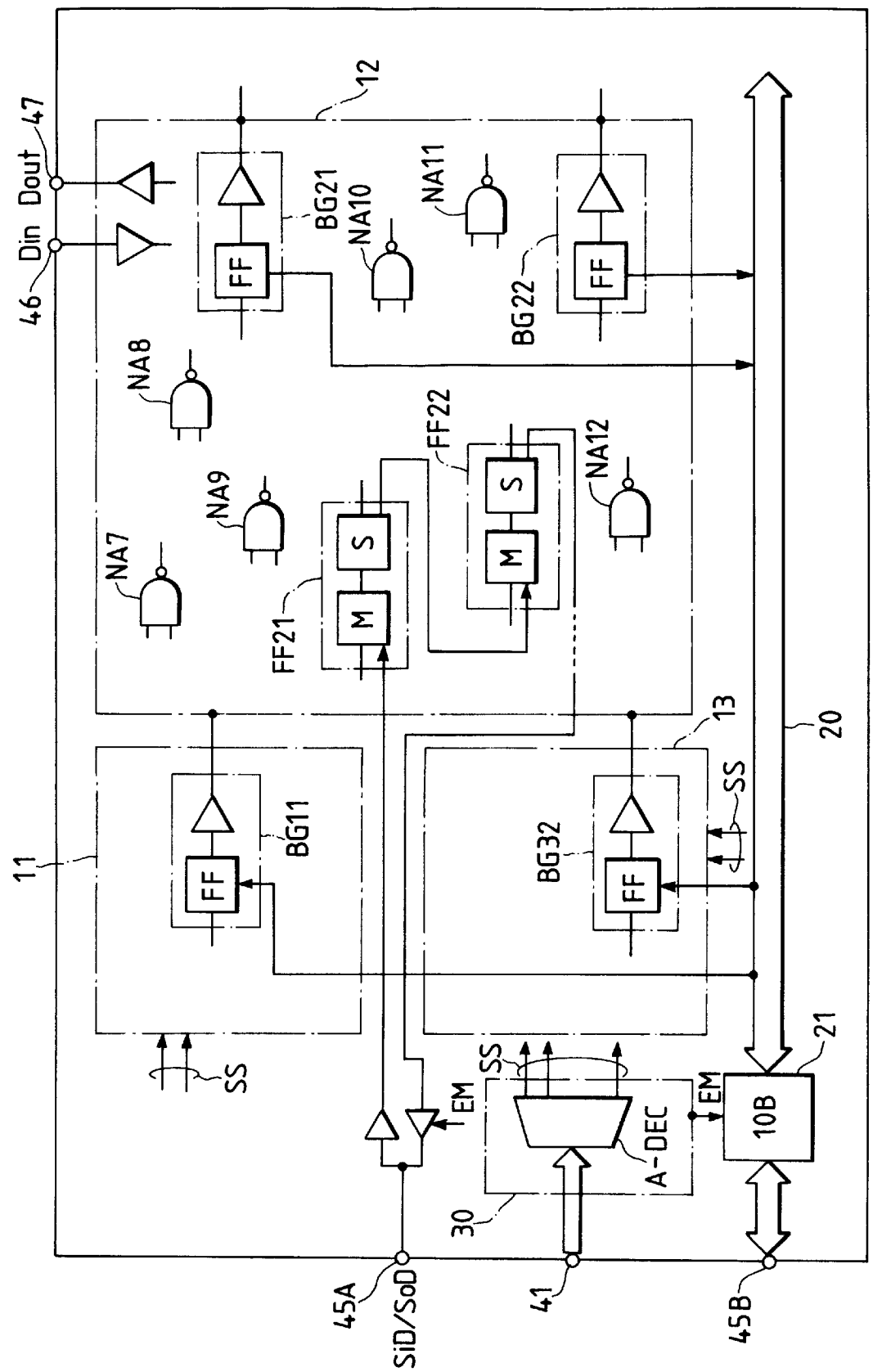
FIG. 6 is an explanation diagram showing flow of data in the case of diagnosing a random logic portion in shift scan system.

FIG. 6 shows a semiconductor integrated circuit device (logic LSI) to which the present invention is applied, and shows clearly the flow of data in the case of diagnosing the random logic portion (second functional circuit block) 12 constituting the logic LSI in shift scan system.

In this embodiment, during testing, the flip-flops FF21, FF22 within the random logic portion 12 are connected in series to each other and constituted as a shift register. Further test data can be scan-inputted directly to the shift register from the external terminal 45, or the test results fetched in each of the flip-flops FF21, FF22 can be scan-outputted to the external terminal 45.

Further, a part of the second test data to test function of the random logic portion (second functional circuit block) 12 is supplied using the buffer circuits BG11, BG32, BG41, BG42 with scan function provided in output portion of other functional blocks shown in FIG. 1, i.e., the random logic portion (first functional circuit block) 11, the operation circuit portion (third functional circuit block) 13 and the memory circuit portion (fourth functional circuit block) 14. However, for simplification of the drawings and the specification, in FIG. 6, the memory circuit portion 14 hence the buffer circuits BG41, BG42 with buffer scan function within the memory circuit portion 14 are omitted.

When the test data are held in the buffer circuits 11, 13, the operations are as follows. Selective signal SS including SWi or the like are supplied to the buffer circuits BG11, BG32 with a scan function within each of the functional blocks 11, 13 by the address decoder A-DEC, thereby the buffer circuits BG11, BG13 with a scan function within the functional blocks, 11, 13 (14) as blocks to be tested are selected, and a part of the first test data is inputted and held to the buffer circuits BG11, BG13 with a scan function. Next, the test data are inputted to the random logic portion 12 as the test object block at the test starting. Further since the random logic portion 12 has the external input terminal 46, a part of the second test data is inputted to the random logic portion 12 using also the terminal 46.

Figure 7:
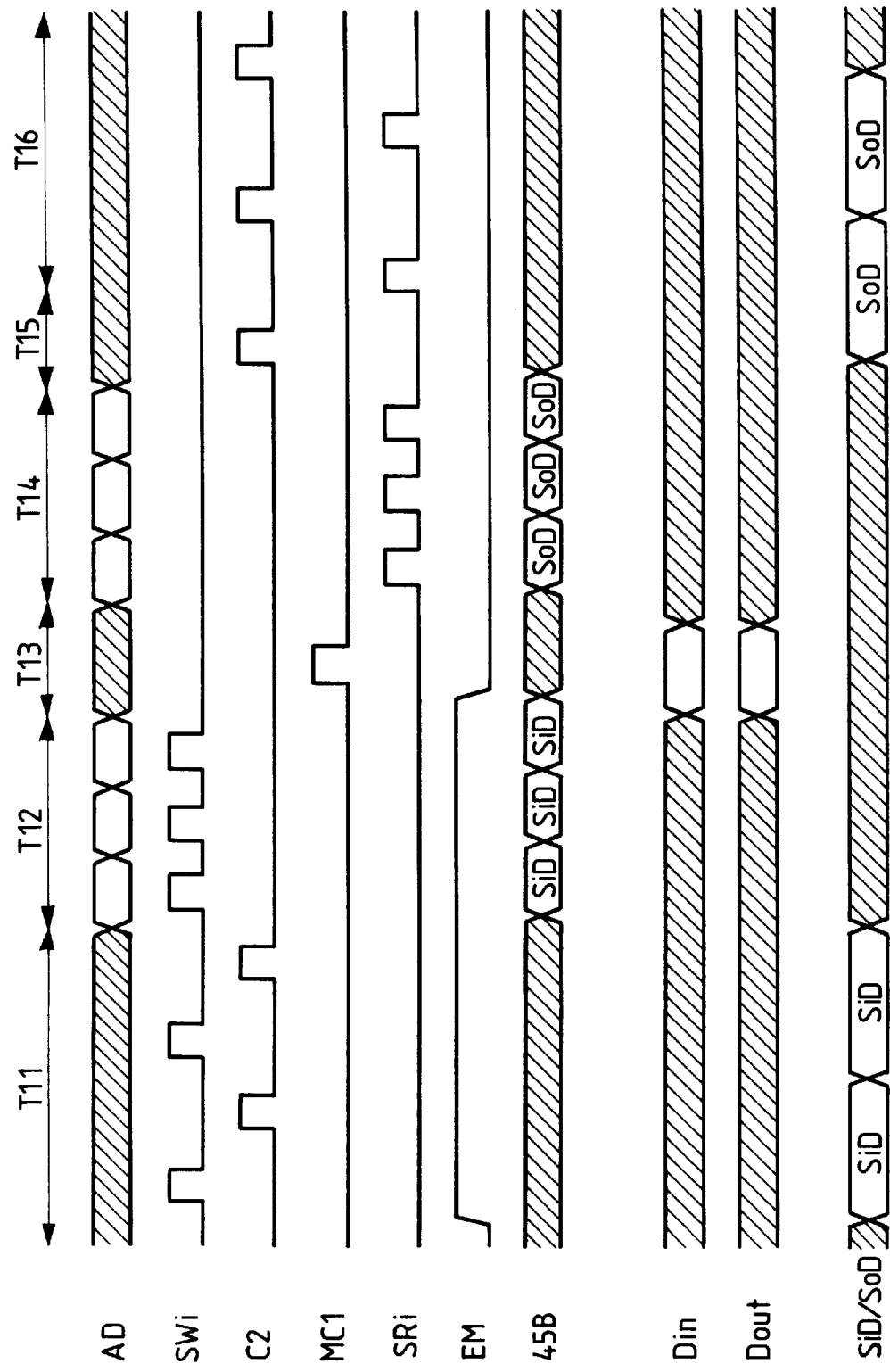
FIG. 7 is a time chart showing timing of various signals in the case of diagnosing a random logic portion in shift scan system.

FIG. 7 shows timing of various signals when the random logic portion (second functional block) 12 is diagnosed in a shift scan system.

First, a test control signal (scan write signal) SWi and a master•slave transfer control signal C2 are supplied alternatively to each flip-flop FFi (i=21, 22) within the random logic portion 12 by a test control circuit 30, and scan-in data SiD are inputted to a test data exclusive terminal 45A from a tester on the outside of the semiconductor integrated circuit device. Test data sets in each flip-flop are transferred from the master latch, and this is repeated thereby a part of the second data is shifted and set in sequence to all flip-flops within the random logic portion 12 (T11). As a result, a part of the second test data set to each flip-flop is supplied to a logic gate of next stage on the tester data setting path within the random logic portion 12.

Next, selective address of the buffer circuit BGj (j=11, 33) with a scan function of the output portion of other functional blocks (second and third functional blocks) 11, 13 is supplied from the external terminal 41 to the test control circuit 30 and decoded, and the test control signal (scan write signal) SWi is supplied to the selected buffer circuit BGj (j=11, 32) with a scan function and at the same time the scan-in data SiD are inputted through the external terminal 45B and the input/output circuit IOB onto the test exclusive bus 20. This is repeated thereby a part of the second test data to be inputted to the random logic portion 12 is set to the buffer circuit BGj (j=11, 32) with a scan function of other functional blocks 11, 13 (T12). Thereby a part of the second data is inputted to the random logic portion 12 from the buffer circuit BGj (j=11, 32) with a scan function of other functional blocks 11, 13.

Subsequently, since the random logic portion 12 has the external input terminal 46, the test input data are set to the terminal. When all test data to be inputted to the random logic portion 12 are set, the control signal MC1 is inputted (T13). As a result, test results to each flip-flop within the random logic portion 12, i.e., results of a part of the inputted second data passing through the logic circuit within the random logic portion 12, are fetched in the flip-flop of next stage and the buffer circuits BG21, BG22 with a scan function of the output portion on the signal transmission path at normal operation state within the random logic portion 12. Then, since the random logic portion 12 has an external output terminal 47, the state of the output signal to the terminal 47 is read by a tester.

Next, a selective address of the buffer circuits BG21, BG22 with a scan function of the output portion of the random logic portion 12 is supplied from the external terminal 41 to the test control circuit 30 and decoded. The test control circuit 30 supplies the test control signal (scan read signal) SRi to the selected buffer circuits BG21, BG22 with scan function. As a result, the scan-out data SoD read out of each of the buffer circuits BG21, BG22 with a scan function are outputted through wiring to the test exclusive bus 20. The scan-out data SoD on the test exclusive bus 20 are outputted through the input/output circuit IOB to the external terminal 45B. This is repeated and the data on the test exclusive bus 20 outputted from the external terminal 45B can be read in sequence by the tester on the outside. Consequently, data to be outputted from the random logic portion 12 to other functional blocks 11, 13, 14 and the outside of the semiconductor integrated circuit deice IC can be known directly using the tester on the outside (T14).

Subsequently, the master•slave transfer control signal C2 is supplied to all flip-flops within the random logic portion 12 (T14). Then in each flip-flop, the test results fetched in the master latch are transferred to the slave latch.

The test control signal (scan read signal) SRi and the master•slave transfer control signal C2 are supplied alternately to each flip-flop FFi (i=21, 22) within the random logic portion 12. Then data held in each flip-flop by the control signal SRi are transferred to next flip-flop on the data transmission path at a diagnosis state of the random logic portion and transferred from the master latch to the slave latch by the control signal C2. This is repeated thereby the test results of all flip-flops within the random logic portion 12 are outputted to the external terminal 45B. This is read in sequence by the tester on the outside thereby the test results held in all flip-flops within the random logic portion 12 can be known directly from the outside (T16).

Next, a concrete method in the case of diagnosing the memory circuit portion 14 having the buffer with a scan function in the output portion will be described using FIG. 8 and FIG. 9.

When the memory is tested, it is efficient if the test function of the memory (pattern generator for automatically generating the test patterns of the memory) installed as standard in the tester is utilized. Therefore in this embodiment, when the memory circuit portion 14 is diagnosed, constitution of the test control circuit 30 and connection of the buffer circuit with a scan function have been thought out so that the memory circuit portion 14 is seen from the outside as if it were a single memory.

The case that the memory circuit portion 14 is constituted by so-called clocked static RAM will be described as an example more specifically.

Figure 8:
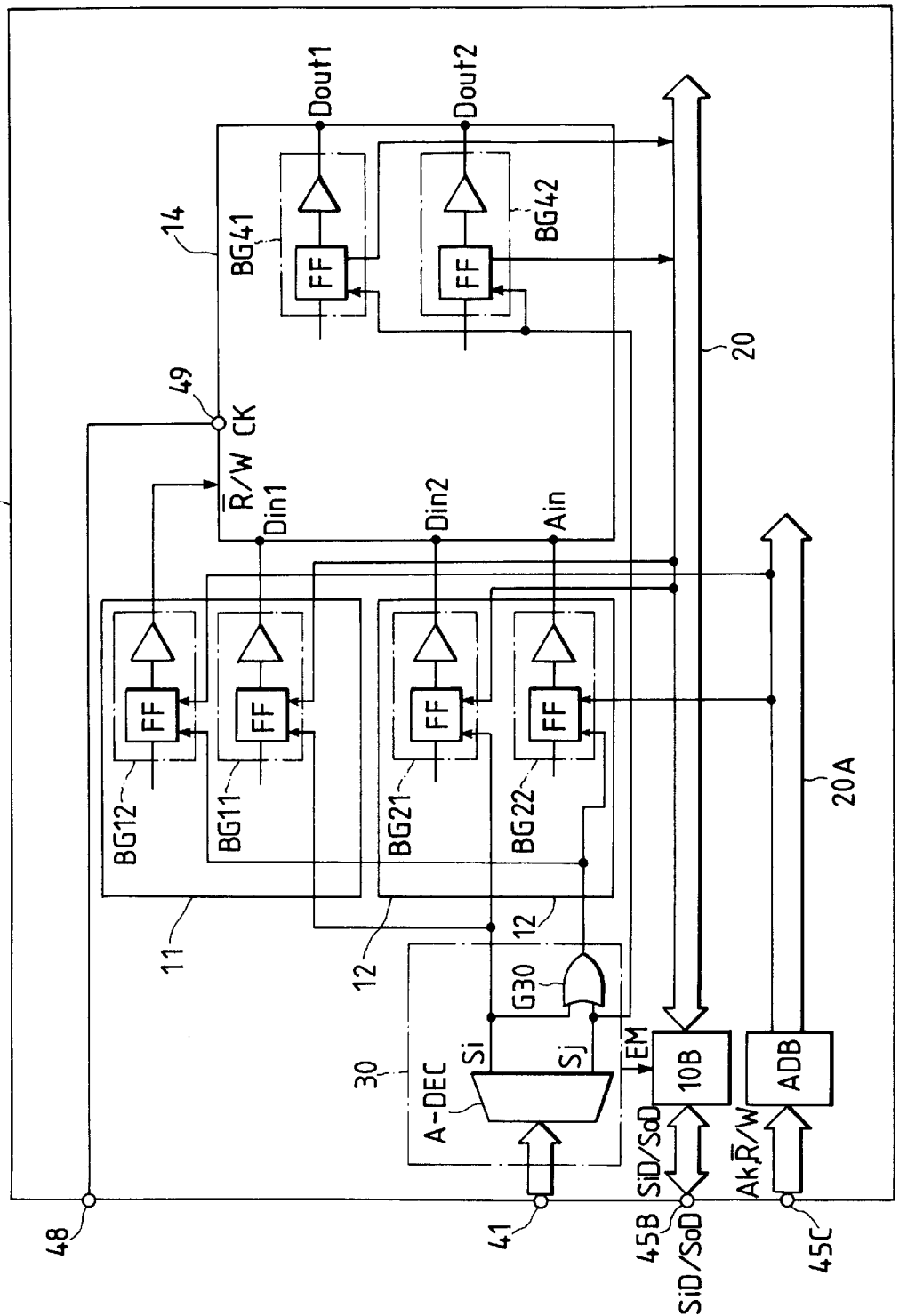
FIG. 8 is an explanation diagram showing flow of data in the case of diagnosing a memory circuit portion having a buffer circuit with scan function at output portion.

FIG. 8 shows a semiconductor integrated circuit device (logic LSI) to which the present invention is applied, and shows clearly the flow of data in the case of diagnosing the memory circuit portion 14 constituting the semiconductor integrated circuit device. The semiconductor integrated circuit device in this embodiment includes an input terminal 48 to which a clock signal is inputted. The memory circuit portion 14 is provided with a control input terminal exclusive for inputting the clock CK based on the clock signal inputted to the semiconductor integrated circuit device. Synchronization of operation of the memory is taken by the clock CK.

Further in this embodiment, in addition to the testing exclusive bus 20 as above described, during testing of the memory circuit portion 14, an address bus 20 exclusive for input is provided. Also, selective signals SS supplied to the functional blocks, 11, 12 and 14 by the address decoder A-DEC within the test control circuit 30 is constituted so that the test control signal S1 is supplied at the write cycle simultaneously to the buffers BG11, BG12, BG21, BG22 with a scan function of the output portion within other functional blocks (random logic 11, 12) to form input data signals for the memory circuit portion 14, and the test control signal Sj is supplied at the read cycle simultaneously to the buffers BG41, BG42 with a scan function of the output portion within the memory circuit portion 14.

That is, the same address i is allocated to the buffers BG11 and BG21 with scan function respectively. Since the address i is assigned by the address decoder A-DEC during the write cycle, the buffers BG11 and BG21 with a scan function are selected simultaneously.

The test exclusive bus 20 includes a plurality of bus lines coupled with the buffers BG11 and BG21 with a scan function respectively, so that different data can be supplied respectively to the buffers BG11 and BG21 with a scan function. Thereby during the write cycle, the buffers BG11 and BG21 with a scan function can supply different data on the test exclusive bus 20 to the memory circuit portion 14 respectively.

The same address j is allocated to the buffers BG41 and BG42 with scan function respectively. Since the address j is allocated by the address decoder A-DEC during the write cycle, the buffers BG41 and BG42 with a scan function are selected simultaneously.

Also the test exclusive bus 20 includes a plurality of bus lines coupled with the buffers BG41 and BG42 with a scan function respectively, so that different data can be received respectively from the buffers BG41 and BG42 with a scan function. Thereby during the read cycle, different data can be read onto the test exclusive bus 20 by the buffers BG41 and BG42 with a scan function.

In order that the scan-in control signals can be inputted in any of the write cycle and the read cycle to the buffer BG22 with a scan function of the output portion within other functional block (random logic 12 in the figure) to form address signals for the memory circuit portion 14 and to the buffer BG12 with a scan function within other functional block (random logic 11 in the figure) to form R/W signals, a gate circuit G30 to take logical sum between the test control signals Si and Sj is provided within the test control circuit 30, and these signals can be supplied to the buffer BG42 for address output and the buffer BG12 for R/W signal output simultaneously.

That is, the buffers BG11 and BG22 with scan function are supplied with addresses i, j substantially. In other words, when the decoder selects the addresses i, j, the buffers BG11 and BG22 with a scan function can be selected simultaneously. Then the buffer BG12 with a scan function supplies data from a certain bus line to constitute the address bus as R/W signal to the memory circuit portion 14. Also the buffer BG22 with a scan function supplies data from a certain bus line to constitute the address bus 20A as address signal Ain to the memory circuit portion 14.

Thereby at the write cycle, address signals Ain and $\overline{R/W}$ of the memory given from the tester on the outside are supplied through the test exclusive address 20A and the buffers BG22, BG12 with a scan function within the random logic 12 to the memory circuit portion 14, and a plurality of written data in this case are fetched through the test exclusive bus 20 and the buffers BG11 and BG21 with a scan function within the random logic 11 and 12 to the memory circuit portion 14 simultaneously.

On the other hand, at the read cycle, address signals Ain and R/W of the memory given from the tester on the outside are supplied through the test exclusive address bus 20A and the buffers BG22 and BG12 with a scan function within the random logic 12 to the memory circuit portion 14, and read data simultaneously read out of a prescribed region within the memory circuit portion 14 assigned by the address signal Ain are outputted from the buffers BG41, BG42 with a scan function with the memory circuit portion 14 directly onto the plural bus lines of the test exclusive bus 20 and the plural data on the test exclusive bus 20 are read by the tester on the outside.

Figure 9:
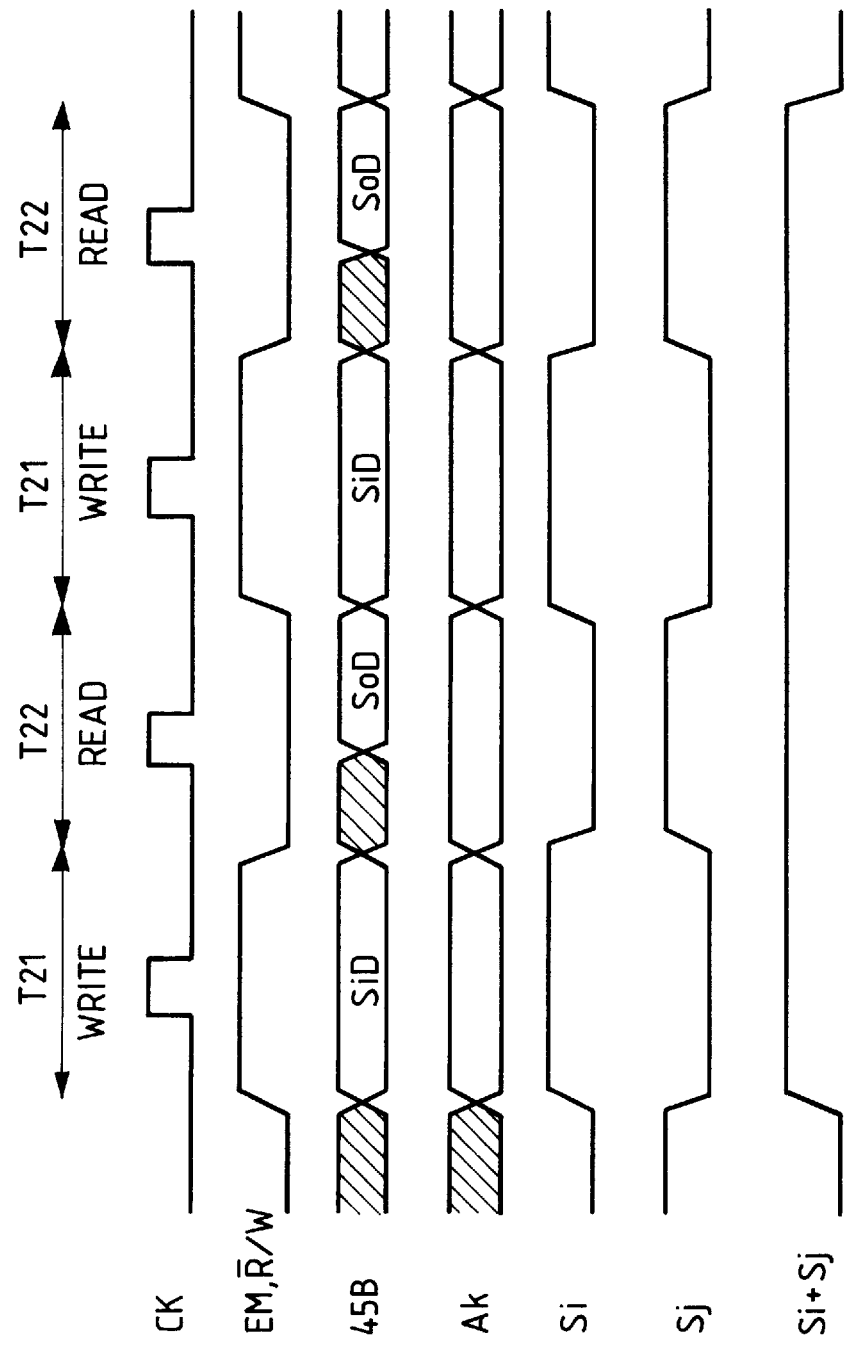
FIG. 9 is a time chart showing timing of various signals in the case of diagnosing a memory circuit portion using a pattern generator of a tester.

FIG. 9 shows timing of various signals in the case of diagnosing the memory circuit portion 14 using a pattern generator of the tester.

First, the test control signals TE, SWi and SRi and the selective address i are inputted from the input terminal 41 to the test control circuit 30. Then by the test control circuit 30, the test control signal Si is supplied to the buffers BG11, BG12, BF21, BG22 with a scan function with the random logic portions 11, 12.

Also in synchronization with this, the read write control signal $\overline{R/W}$ for the memory and the address signal Ak are inputted to the test address exclusive terminal 45C, and a plurality of scan-in data Sid are inputted to the test data exclusive terminal 45B.

Then the read•write control signal $\overline{R/W}$ and the address signal Ak of the memory are supplied through the address buffer ADB and the test exclusive address bus 20A and through the buffer BG12 with a scan function within the random logic 11 and the buffer 22, . . . with a scan function with the random logic 12 to the memory circuit portion 14, and a plurality of write data are supplied through the test exclusive bus 20 and the buffers BG11, BG21, BG22 with a scan function within the random logic 11, 12 to the memory circuit portion 14 simultaneously. In this state, when the clock CK is inputted to the control input terminal 49 from the outside, based on high level of the read/write control signal $\overline{R/W}$ (write mode), write of data is carried out (write cycle T21).

Next, the test control signal and the selective address j of the memory circuit are inputted from the input terminal 41 to the test control circuit 30. Then the test control signal Sj is supplied from the test control circuit 30 to the buffers BG41, BG42 . . . with a scan function within the memory circuit portion 14. Also in synchronization with this, the address signal Ak of the memory is inputted to the test address exclusive terminal 45C.

Then the read/write control signal $\overline{R/W}$ of the memory and the address signal Ak are fetched through the address buffer ADB and test exclusive address bus 20A into the buffer BG12 with a scan function within the random logic 12 and applied to the memory circuit portion 14. When the clock CK is inputted from the outside of the memory circuit portion 14 to the control signal $\overline{R/W}$ of the memory and the address signal Ak are fetched through the address buffer ADB and the test exclusive address bus 20A into the buffer BG12 and the buffer circuit BG22, . . . with a scan function within the random logic 12 and applied to the memory circuit portion 14. When the clock CK is inputted from the outside of the memory circuit portion 14 to the control input terminal 49, the read/write control signal $\overline{R/W}$ is made low level (read mode) thereby a plurality of data stored in a prescribed region within the memory circuit portion 14 assigned by the address signal Ain are read out, and the read data are outputted onto the test exclusive bus 20 (read cycle T22).

The write cycle and the read cycle are executed repeatedly and the read data outputted onto the test exclusive bus 20 are read by the tester on the outside and compared with an expected value thereby diagnosis of the memory circuit portion 14 can be carried out.

Figure 10:
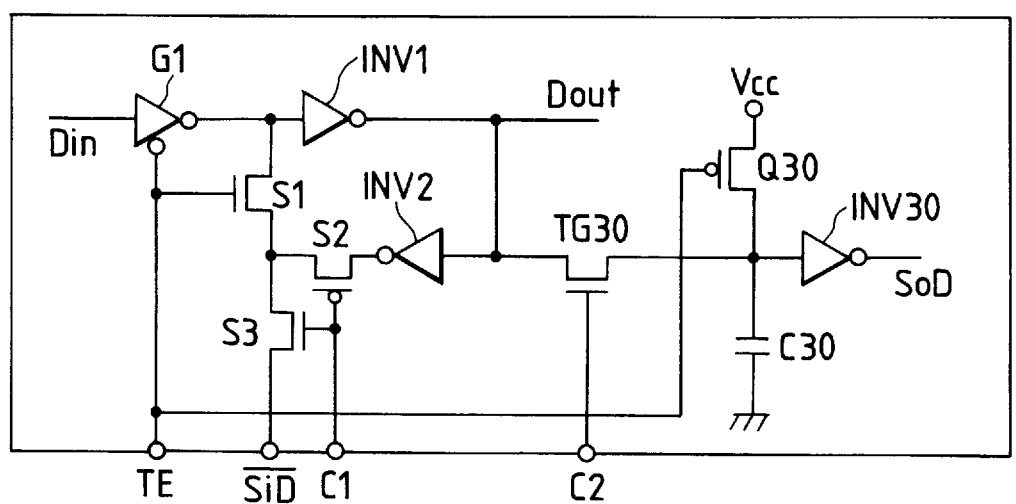
FIG. 10 is a circuit constitution diagram showing another embodiment of a buffer circuit with scan function.

FIG. 10 shows another embodiment of a buffer circuit with a scan function. The buffer circuit with a scan function in this embodiment is a preferable circuit example in constitution that data latched to a buffer installed at output portion of each functional block can be read out in a shift scan system.

The buffer circuit with a scan function has large circuit scale in comparison with the buffer with a scan function preferable in address scan system (refer to FIG. 2), but is effective [in using] in the case where all functional blocks of the semiconductor integrated circuit adopt a shift scan system as a diagnosis system, because the address scan control circuit need not be installed in order to read out only data latched to the buffer provided at output portion of each functional block.

In order to read the latched data in a shift scan system, the buffer circuit with a scan function of the embodiment in FIG. 10 is constituted in that the circuit shown in FIG. 2 is made a master latch, and a slave latch comprising a transfer gate TG30, a capacitor C30 for data holding and an inverter INV30 is connected to rear stage of the master latch, and scan-out data SoD are outputted from the inverter INV30. Also, in order to prevent a through current from flowing through the inverter INV30 at normal operation mode, a pull-up at normal operation mode, a pull-up MOS Q30 is connected between the input terminal of the inverter INV30 and the power source voltage Vcc.

The control signal TE to be applied to a switch S1 constituting the master latch is applied commonly to the gate terminal of the MOS Q30. Also the master•slave transfer control signal C2 is applied to the control terminal of the transfer gate T30. To the control terminal of switches S2, S3 constituting the master latch, in place of the test control signal SWi serving also as a signal to command the scan in and to assign (select) the buffer, the shift control signal Ci to perform shift between buffers is applied commonly with other buffer.

The buffer circuit with scan function operates in four modes as shown in FIG. 13 by the three control signals TE, C1, C2. That is, when the control signals TE, C1, C2 are all at a low level, the switch S1 is turned off and the logic gate G1 is activated, thereby the buffer circuit functions as a buffer to make an input signal pass intact. Then, since the pull-up MOS Q30 is turned on by the control signal TE, the scan-out data $\overline{Sod}$ are fixed to a low level.

Also, in the state that the control signal TE is made high level and the logic gate G1 is not activated, if the shift control signal C1 (pulse) is inputted, while the signal C1 is at a high level, the switch S2 is turned off and the switch S3 is turned on, and the scan-in data SiD supplied then are fetched in the master latch circuit comprising the inverters INV1 and INV2, and when the control signal C1 is varied to a low level, the fetched data are held. Then since the transfer gate T30 is interrupted by the control signal C2 of low level, racing to the slave latch is prevented.

On the other hand, in the state that the control signal TE is made high level and the logic gate G1 is not activated by the shift control signal C2 (pulse), the transfer gate TG30 is rendered conductive and data held in the master latch are transferred to the slave latch. Then, since the pull-up MOS Q30 is turned off, charge corresponding to the held data of the master latch is charged in the capacitor C30, and when the control signal C2 is varied to a low level, the fetched data are held to the slave latch and the held data are outputted as the scan-out data SoD by the inverter INV30.

Further, in the buffer circuit with a scan function, in the state that the control signals C1, C2 are made low level and the switch S2 is turned on and the transfer gate TG30 is interrupted, the control signal TE (pulse) is inputted thereby the logic gate G1 is activated temporarily and the signal of the inner circuit (test results) can be fetched in the master latch and held. And then the shift control signal C2 (pulse) is entered in similar manner to the above description, the held data can be transferred to the slave latch and outputted as the scan-out signal SoD.

In the embodiment as above described, although dividing is carried out into two random logic portions, the memory circuit portion and the operation circuit portion operate as a diagnosis unit so as to diagnose the semiconductor integrated circuit device formed on one semiconductor substrate efficiently, each functional block as above described may be further divided into small blocks and diagnosis may be carried out in each small block. Usually in design of the semiconductor integrated circuit device, since the semiconductor integrated circuit device is divided into a plurality of functional blocks and design is carried out hierarchically, diagnosis circuits may be constituted respectively according to dividing in each hierarchy.

Also, scale of the diagnosis unit may be that production of the test program to diagnose a certain divided diagnosis unit can be carried out independently of the process to produce the test program to diagnose other diagnosis units.

Figure 11:
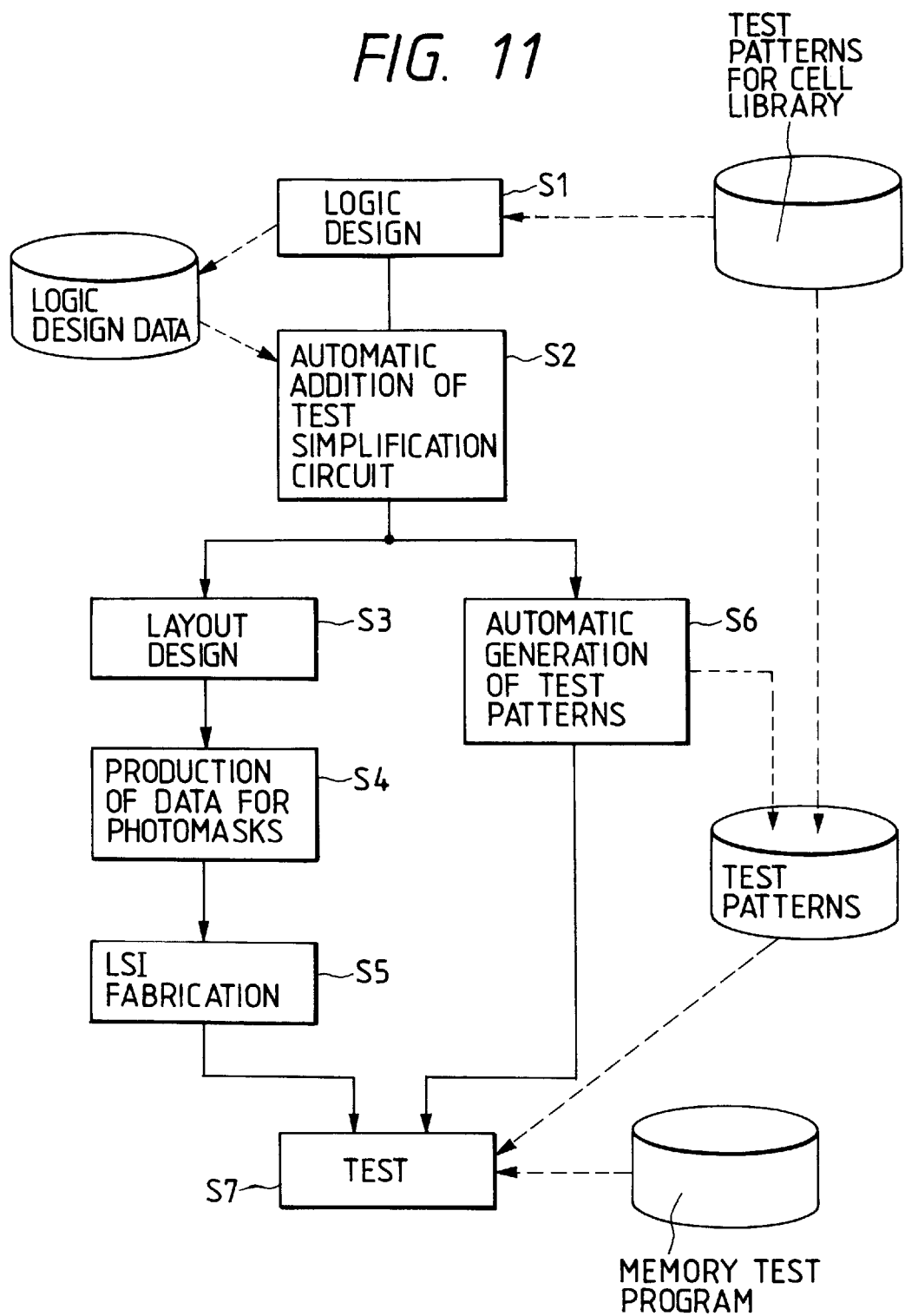
FIG. 11 is a flow chart showing an example of design procedure of a semiconductor integrated circuit device in the case of applying diagnosis system of the inventions.

Next, an example of design procedure of a semiconductor integrated circuit device (hereinafter referred to also as "logic LSI or LSI") in the case of applying diagnosis system of the present invention will be described in FIG. 11.

First, logic design is carried out not considering a diagnosis circuit (step S1). Then if design data of a functional block being designed and used already in other LSI and having actual results are registered as macro cells in data registration means, called a cell library to store and hold the design data, this is used thereby the logic design can be carried out efficiently. After finishing the logic design, based on the logic data, using a computer, addition of a test simplification circuit, that is, addition of a buffer circuit with a scan function as shown in FIG. 2 or addition of a buffer circuit with a scan function to a flip-flop is carried out, thereby changing to a flip-flop of master•slave type as shown in FIG. 3 is carried out (step S2). And then, based on the logic design data with the test simplification circuit, on one hand, layout design of a circuit or wiring is carried out (step S3), and production of data for photomasks is carried out (step S4) and process is transferred to fabrication of LSI (step S5).

At the step of completing the logic design data with the test simplification circuit, concurrently with the layout design, based on the logic design data, in each functional block (except memory), automatic generation of test patterns is carried out (step S6) and this is stored in a file. In this case, if a macro cell registered in a cell library in the logic design is used, since test patterns for the macro cell already produced and registered in the file can be utilized, this is used as a part of test patterns of LSI at present and stored in the file.

After finishing the fabrication of LSI in step S5 and generation of test patterns in step S6, regarding the fabricated LSI, using test patterns stored in the file, testing is carried out in each functional block (step S7). Also, when the LSI contains the memory, testing of a memory portion is carried out using the test function of the memory installed in the tester.

As above described, in the embodiment, a circuit within the logic LSI is divided into a plurality of functional blocks and an output portion of each functional block is provided with a buffer circuit with a scan function capable of changing function of latching data by a control signal and function of making an input signal pass intact. These buffer circuits are connected to a test exclusive bus and the test data can be entered directly to the buffer or read out of the buffer circuit, thereby the test patterns can be generated in each functional block and test can be carried out in each functional block. When the functional block once designed is used for other LSI, test patterns already generated can be utilized, thereby the effect is in that time required for generation of test patterns and for the test can be significantly reduced in comparison with diagnosis system in the prior art.

Also, since flip-flops within each functional block are connected to the test exclusive use and the test data can be scanned in or scanned out directly, even if logic is complicated, the test data can be entered directly in the flip-flop in the inside, thereby, together with effect that the test can be carried out in each functional block, there is effect that the test time can be reduced significantly.

In the embodiment, diagnosis of a functional block has been explained in the case of performing in an address scan system and performing in a shift scan system respectively referring to FIG. 4 and FIG. 6. When diagnosis of these functional block is carried out, in FIG. 4, a method of inputting the test data to a buffer with a scan function of other functional block and to inner flip-flops has been described, and in FIG. 6, as a method of inputting the test data to a buffer with scan function, a method of inputting the test data on one test exclusive bus 20 one by one in each buffer with a scan function or each flip-flop respectively allocated to different addresses has been described. The present invention is not limited to this, but the test exclusive bus 20 includes a plurality of bus lines and the same address corresponding to the bus line of the embodiment may be allocated to a plurality of buffers with a scan function of flip-flops.

In this case, different test data are supplied simultaneously from a plurality of bus lines respectively to a plurality of buffers with scan function and flip-flops having the same address. Therefore, during the diagnosis, the data write time to the buffers with a scan function and the flip-flops is reduced, and the diagnosis time of each functional block further the diagnosis time of the semiconductor integrated circuit device can be reduced.

Also in the embodiment, although the write data to the memory circuit portion to carry out diagnosis of the memory circuit portion 14 are simultaneously inputted from a plurality of test exclusive buses 20 using a buffer with a scan function on the outside of the memory circuit block 14 allocated to the same address, constitution is not limited to this. For example, buses with a scan function having different addresses respectively and coupled with each one test exclusive bus 20 may be included.

Further, in the embodiment, while the memory circuit portion is diagnosed, the test control signal R/W to be supplied to the memory circuit portion is supplied to the memory through a buffer circuit with a scan function installed on output portion of other functional blocks, but it may be supplied directly to the memory circuit portion from the outside of the semiconductor integrated circuit device. Further, the buffer circuit with a scan function described in the embodiment is an example, and various modifications may be thought such that the slave latch of the buffer circuit shown in FIG. 10 may be constituted by two inverters in similar manner to the master latch.

Although the invention made by the present inventor has been described mainly in the case of application to the logic LSI being the utilization field as the background art of the invention, the invention is not limited to this but may be utilized in [the two] semiconductor integrated circuit devices where a digital circuit and an analog circuit are mixed.

Effects obtained by the representative invention disclosed in the present patent application will be briefly described as follows.

In the development of the logic integrated circuit with a diagnosis function, time required for generation of test patterns and for the test can be significantly reduced in comparison with the diagnosis method in the prior art.

What is claimed is:

1. A semiconductor integrated circuit device formed on one semiconductor substrate, the device comprising:

an external terminal;

a plurality of functional circuit blocks having a prescribed logic circuit, respectively, wherein one of the plurality of functional circuit blocks includes a master-slave flip-flop having two latch circuits, and wherein each of the other of the plurality of functional circuit blocks includes at least one first buffer circuit essentially consisting of one latch circuit and wherein the one of the plurality of functional circuit blocks includes a second buffer circuit having one latch circuit; and a control circuit which outputs control signals for controlling the first buffer circuits, the second buffer circuit, and the master-slave flip-flop, wherein the master-slave flip-flop fetches first data supplied from the external terminal when the control signals are supplied to the master-slave flip-flop, and outputs the first data to the prescribed logic circuit in the one of the plurality of functional circuit blocks in accordance with the control signals, and wherein the first buffer circuits fetch second data supplied from the external terminal when the control signals are supplied to the first buffer circuits after the first data is fetched from the master-slave flip-flop, and outputs the second data to the prescribed logic circuit in the one of the plurality of functional circuit blocks, in order to test a logic function of the prescribed logic circuit in the one of the plurality of functional circuit blocks, and wherein the second buffer circuit fetches third data outputted from the prescribed logic circuit in the one of the plurality of functional circuit blocks, the prescribed logic circuit being tested on the basis of the first and second data, and outputs the third data to the external terminal when the control signals for controlling the second buffer circuit are supplied to the second buffer circuit, and wherein the master-slave flip-flop fetches fourth data outputted from the prescribed logic circuit in the one of the plurality of functional circuit blocks, and outputs the fourth data to the external terminal when the control signals for controlling the master-slave flip-flop are supplied to the master-slave flip-flop.

2. The semiconductor integrated circuit device formed on one semiconductor substrate according to claim 1 further comprising:

a bus coupled to the external terminal, to the first and second buffer circuits and to the master-slave flip-flop, in order to transfer the first to fourth data.

3. The semiconductor integrated circuit device formed on one semiconductor substrate according to claim 2, wherein the control circuit includes an address decoder which selects the first and second buffer circuits and the master-slave flip-flop pursuant to address signals supplied from outside of the semiconductor integrated circuit device.

4. The semiconductor integrated circuit device formed on one semiconductor substrate according to claim 3, wherein the second buffer circuit further includes buffer means for passing intact the third data supplied from the prescribed logic circuit in the one of the plurality of functional circuit blocks.

5. The semiconductor integrated circuit device formed on one semiconductor substrate according to claim 4, wherein the second buffer circuit includes:

a first logic gate, coupled to the one latch circuit of the second buffer circuit, to selectively pass the third data or interrupt the third data pursuant to the part of the control signals supplied from the control circuit;

a first gate which interrupts a return path of the one latch circuit thereof pursuant to the control signals, and a second gate which outputs the third data in the one latch circuit thereof.

6. The semiconductor integrated circuit device formed on one semiconductor substrate according to claim 5, wherein each first buffer circuit includes:

a third gate which interrupts a return path of the one latch circuit thereof pursuant to the control signals, and a fourth gate which fetches the second data into the one latch circuit thereof.

7. The semiconductor integrated circuit device formed on one semiconductor substrate according to claim 5, wherein the first and fourth data are transferred between the two latch circuits of the master-slave flip-flop pursuant to the control signals.

8. A semiconductor integrated circuit device formed on one semiconductor substrate, the device comprising:

an external terminal;

a plurality of functional circuit blocks having a prescribed logic circuit, respectively, wherein one of the plurality of functional circuit blocks includes a master-slave flip-flop having two latch circuits and wherein each of the other of the plurality of functional circuit blocks includes at least one first buffer circuit essentially consisting of one latch circuit; and wherein the one of the plurality of functional circuit blocks includes a second buffer circuit having one latch circuit and wherein the one of the plurality of functional circuit blocks includes a second buffer circuit having one latch circuit; and a control circuit which outputs control signals for controlling the first buffer circuits and the master-slave flip-flop, wherein the master-slave flip-flop fetches first data supplied from the external terminal when the control signals are supplied to the master-slave flip-flop, and outputs the first data to the prescribed logic circuit in the one of the plurality of functional circuit blocks in accordance with the control signals, and wherein the first buffer circuits fetch second data supplied from the external terminal when the control signals are supplied to the first buffer circuits after the first data is fetched from the master-slave flip-flop, and outputs the second data to the prescribed logic circuit in the one of the plurality of functional circuit blocks, in order to test a logic function of the prescribed logic circuit in the one of the plurality of functional circuit blocks;

wherein the second buffer circuit fetches third data outputted from the prescribed logic circuit in the one of the plurality of functional circuit blocks, the prescribed logic circuit being tested on the basis of the first and second data, and outputs the third data to the external terminal when the control signals for controlling the second buffer circuit are supplied to the second buffer circuit, and, wherein the one of the plurality of functional circuit blocks includes a second master-slave flip-flop coupled in series to the master-slave flip-flop.

9. The semiconductor integrated circuit device formed on one semiconductor substrate according to claim 8, wherein the master-slave flip-flop fetches fourth data outputted from the tested prescribed logic circuit in the one of the plurality of functional circuit blocks, and outputs the fourth data to the second master-slave flip-flop when the control signals for controlling the master-slave flip-flop are supplied to the master-slave flip-flop, and wherein the second master-slave flip-flop fetches the fourth data outputted from the master-slave flip-flop in accordance with the control signals, and outputs the fourth data to the first external terminal when the control signals for controlling the second master-slave flip-flop are supplied to the second master-slave flip-flop.

10. The semiconductor integrated circuit device formed on one semiconductor substrate according to claim 9 further comprising:

a bus coupled to the external terminal and to the first and second buffer circuits, in order to transfer the second and third data.

11. The semiconductor integrated circuit device formed on one semiconductor substrate according to claim 10, wherein the control circuit includes an address decoder which selects the first and second buffer circuits pursuant to address signals supplied from outside of the semiconductor integrated circuit device.

12. The semiconductor integrated circuit device formed on one semiconductor substrate according to claim 11, wherein the second buffer circuit further includes buffer means for passing intact the third data supplied from the prescribed logic circuit in the one of the plurality of functional circuit blocks.

13. The semiconductor integrated circuit device formed on one semiconductor substrate according to claim 12,
   wherein the second buffer circuit includes:
      a first logic gate, coupled to the one latch circuit of the second buffer circuit, to selectively pass the third data or interrupt the third data pursuant to the control signals supplied from the control circuit;
      a first gate which interrupts a return path of the one latch circuit thereof pursuant to the control signals, and
      a second gate which outputs the third data in the one latch circuit thereof.

14. The semiconductor integrated circuit device formed on one semiconductor substrate according to claim 13
   wherein each first buffer circuit includes:
      a third gate which interrupts a return path of the one latch circuit thereof pursuant to the control signals, and
      a fourth gate which fetches the second data into the one latch circuit thereof.

15. A semiconductor integrated circuit device formed on one semiconductor substrate, the device comprising:
   an external terminal;
   a plurality of functional circuit blocks having a prescribed logic circuit, respectively, wherein one of the plurality of functional circuit blocks includes a master-slave flip-flop having two latch circuits and wherein each of the other of the plurality of functional circuit blocks includes at least one first buffer circuit essentially consisting of one latch circuit; and
   a control circuit which outputs control signals for controlling the first buffer circuits and the master-slave flip-flop,
   wherein the master-slave flip-flop fetches first data supplied from the external terminal when the control signals are supplied to the master-slave flip-flop, and outputs the first data to the prescribed logic circuit in the one of the plurality of functional circuit blocks in accordance with the control signals, and
   wherein the first buffer circuits fetch second data supplied from the external terminal when the control signals are supplied to the first buffer circuits after the first data is fetched from the master-slave flip-flop, and outputs the second data to the prescribed logic circuit in the one of the plurality of functional circuit blocks, in order to test a logic function of the prescribed logic circuit in the one of the plurality of functional circuit blocks, and
   wherein the one of the plurality of functional circuit blocks includes a second master-slave flip-flop coupled in series to the master-slave flip-flop.

16. A method of diagnosing a semiconductor integrated circuit device on a single chip, coupled to a tester, which device comprises:
   a first external terminal,
   a second external terminal;
   a plurality of functional circuit blocks having a prescribed logic circuit, respectively, wherein one of the plurality of functional circuit blocks includes a second buffer circuit having one latch circuit and a master-slave flip-flop having first and second latch circuits, and wherein each of the other of the plurality of functional circuit blocks includes at least one first buffer circuit essentially consisting of one latch circuit; and
   a control circuit which outputs control signals for controlling the first and second buffer circuits and the master-slave flip-flop,
   wherein the master-slave flip-flop fetches first data supplied from the first external terminal when the control signals are supplied to the master-slave flip-flop, and outputs the first data to the prescribed logic circuit in the one of the plurality of functional circuit blocks in accordance with the part of the control signals;
   wherein the first buffer circuits fetch second data supplied from the first external terminal when the control signals are supplied to the first buffer circuits, and outputs the second data to the prescribed logic circuit in the one of the plurality of functional circuit blocks, in order to test a logic function of the prescribed logic circuit in the one of the plurality of functional circuit blocks;
   wherein the second buffer circuit fetches third data outputted from the prescribed logic circuit in the one of the plurality of functional circuit blocks, the prescribed logic circuit being tested on the basis of the first and second data, and outputs the third data to the first external terminal when the control signals for controlling the second buffer circuit are supplied to the second buffer circuit, and
   wherein the control circuit includes an address decoder which selects the first and second buffer circuits and the master-slave flip-flop pursuant to address signals supplied from the tester,
   the method comprising the steps of:
      (a) selecting the master-slave flip-flop pursuant to the address signals supplied from the tester via the second external terminal;
      (b) setting the first data generated at the tester into the first latch circuit of the master-slave flip-flop;
      (c) transferring the first data from the first latch circuit of the master-slave flip-flop into the second latch circuit of the master-slave flip-flop pursuant to the control signals;
      (d) after the step (c), selecting the first buffer circuits pursuant to the address signals supplied from the tester via the second external terminal, and setting the second data generated at the tester into the one latch circuit of the first buffer circuits;
      (e) supplying the master-slave flip-flop with the control signals, and carrying out a logic operation of the prescribed logic circuit in the one of the plurality of functional circuit blocks on the basis of the first and second data;
      (f) fetching the third data outputted from the prescribed logic circuit in the one of the plurality of functional circuit blocks;
      (g) after the step (f), selecting the second buffer circuit pursuant to the address signals supplied from the tester via the second external terminal, and outputting the third data to the tester via the first external terminal;
      (h) after the step (g), transferring fourth data which is outputted from the prescribed logic circuit in the one of the plurality of functional circuit blocks, from the first latch circuit of the master-slave flip-flop into the second latch circuit of the master-slave flip-flop pursuant to the part of the control signals; and
      (i) after the step (h), selecting the master-slave flip-flop pursuant to the address signals supplied from the tester via the second external terminal, and outputting the fourth data to the tester via the first external terminal.

* * * * *